(12) United States Patent
Stirton et al.

(10) Patent No.: US 6,597,447 B1
(45) Date of Patent: Jul. 22, 2003

(54) METHOD AND APPARATUS FOR PERIODIC CORRECTION OF METROLOGY DATA

(75) Inventors: James Broc Stirton, Austin, TX (US); Kevin R. Lensing, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 58 days.

(21) Appl. No.: 09/919,293

(22) Filed: Jul. 31, 2001

(51) Int. Cl.[7] .............................................. G01B 11/00
(52) U.S. Cl. ................................. 356/237.2; 356/237.3
(58) Field of Search ............................ 356/237.2, 237.3

(56) References Cited

U.S. PATENT DOCUMENTS

| | | | |
|---|---|---|---|
| 4,893,932 A | 1/1990 | Knollenberg | 356/369 |
| 5,383,018 A | 1/1995 | Sadjadi | 356/243.4 |
| 5,487,821 A | 1/1996 | Sieck et al. | 204/192.12 |
| 5,757,474 A | 5/1998 | Sopori et al. | 356/72 |
| 6,038,019 A | 3/2000 | Chang et al. | 356/237.3 |
| 6,225,136 B1 | 5/2001 | Lydon et al. | 438/14 |
| 6,545,755 B1 * | 4/2003 | Ishihama | 356/237.3 |

* cited by examiner

Primary Examiner—Harold I. Pitts
(74) Attorney, Agent, or Firm—Williams, Morgan & Amerson, P.C.

(57) ABSTRACT

A method and an apparatus for performing periodic correction of metrology data. At least one semiconductor wafer is processed. Metrology data from the processed semiconductor wafer is acquired. At least one test wafer is processed. Test wafer metrology data from the processed test wafer is acquired. A test wafer metrology calibration process is performed upon the acquired metrology data using the acquired test wafer metrology data to produce a calibrated metrology data. At least one control input parameter adjustment is performed for subsequent manufacturing processes based upon the calibrated

31 Claims, 9 Drawing Sheets

METHOD AND APPARATUS FOR PERIODIC CORRECTION OF METROLOGY DATA

BACKGROUND OF THE INVENTION

1. Field of the Invention

This invention relates generally to semiconductor manufacturing, and, more particularly, to a method and apparatus for performing a periodic calibration of metrology data results.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using a semiconductor manufacturing tool called an exposure tool or a stepper. Typically, an etch process is then performed on the semiconductor wafers to shape objects on the semiconductor wafer, such as polysilicon lines, each of which may function as a gate electrode for a transistor. As another example, a plurality of metal lines, e.g., aluminum, may be formed that serve as conductive lines that connect one conductive region on the semiconductor wafer to another. The manufacturing tools communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

Figure 1A:
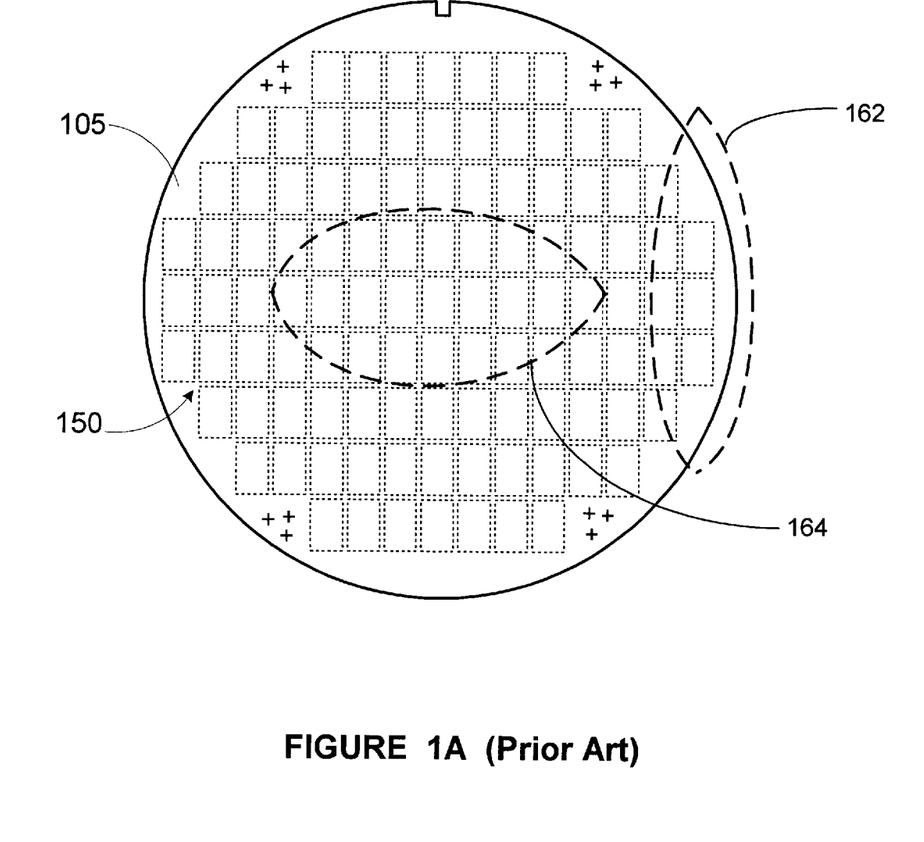
FIG. 1A is a simplified diagram of a prior art semiconductor wafer being processed.

FIG. 1A illustrates a typical semiconductor wafer 105. The wafer 105 typically includes a plurality of individual semiconductor die arranged in a grid 150. Photolithography steps are typically performed by a stepper on approximately one to four die locations at a time, depending on the specific photomask employed. Photolithography steps are generally performed to form patterned layers of photoresist above one or more process layers that are to be patterned. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., linetype features, such as a polysilicon line, or opening-type features, that are to be replicated in an underlying process layer.

Figure 1B:
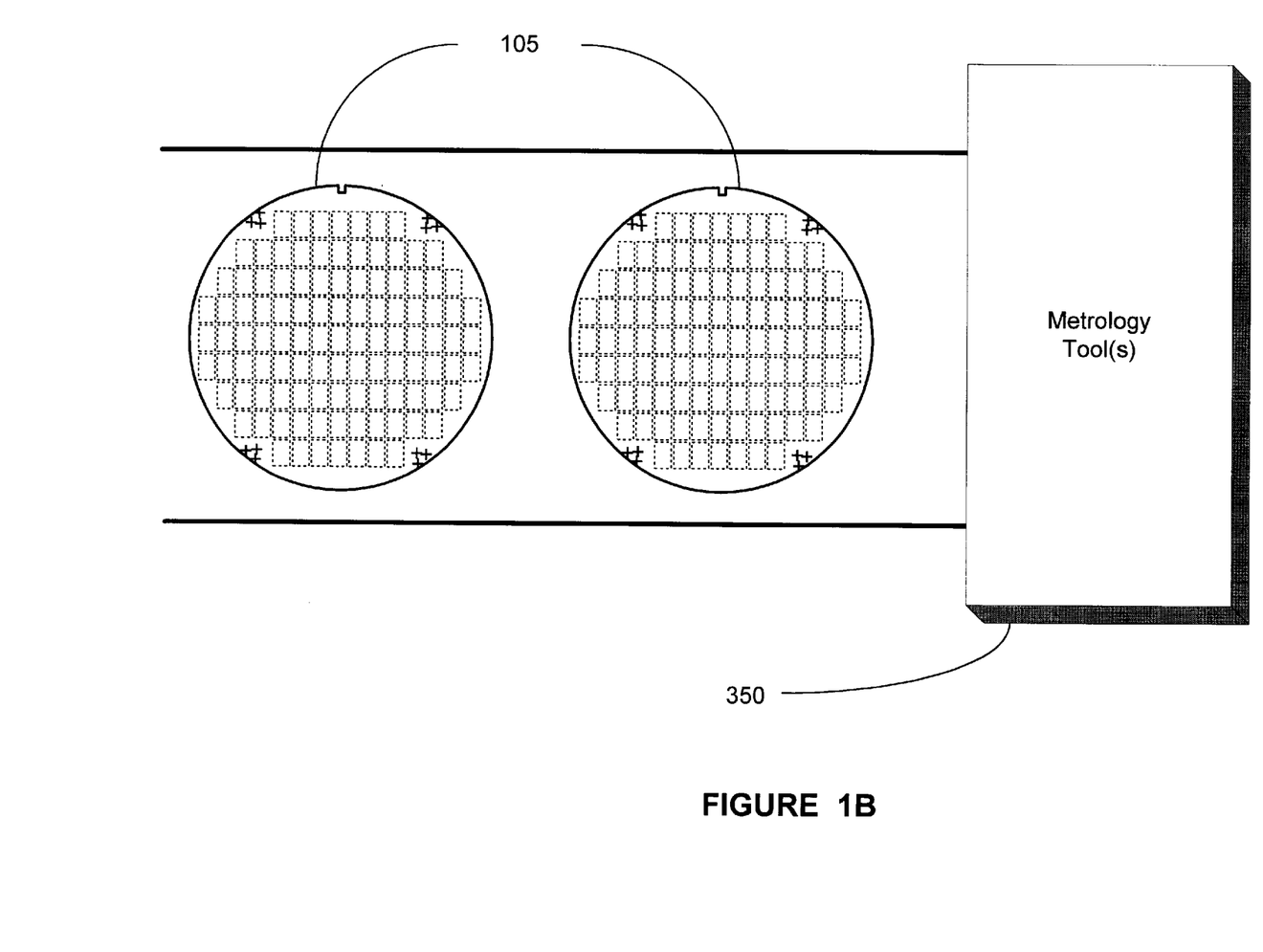
FIG. 1B is a simplified diagram of a plurality of semiconductor wafers being prepared for examination by a metrology tool.

Turning now to FIG. 1B, once at least one manufacturing process is performed upon the semiconductor wafers 105, a metrology tool 350 is used to perform a metrology data acquisition process. The metrology tool 350 acquires metrology data from the processed semiconductor wafers 105. Accuracy of the results acquired by the metrology tool is very important. Metrology data provides information relating to the quality of the processes performed on the semiconductor wafers, the condition of the semiconductor wafers 105 being processed, and information relating to the performance of the devices produced from the processed semiconductor wafers 105. Often, data from the metrology data acquisition process is used to perform adjustments to other manufacturing processes performed on the semiconductor wafers 105. Also, metrology data is used to predict errors that may occur on semiconductor wafers 105 that are subsequently processed. The predicted errors are then used to calculate control parameters for a manufacturing tool during subsequent processing of semiconductor wafers 105.

Many times, metrology tools 350 operate with a slight amount of measurement variation from one time period to another. For example, a particular metrology tool 350 may produce slightly different measurement results from one day to another. Often, environmental factors, such as temperature, pressure, etc., can vary from day to day, causing variations in the operation of the metrology tools 350. Furthermore, other undetectable random variations in the operation of the metrology tools 350 can occur from one time period to another. These variations can cause errors in adjustments made to manufacturing operations during an attempt to compensate for measured errors. For example, metrology tools 350 may be used to measure the critical dimensions (CD) of a feature formed on a semiconductor wafer using a photolithography process. Based upon the CD measurements, adjustments to the photolithography process, such as exposure time, exposure light intensity, etc., are made to compensate for any CD errors detected. Since critical dimension data are represented by very minute measurement, any errors in the CD data can result in significant errors in the overall structures of the features on semiconductor wafers 105. Due to variations in the accuracy of the metrology tool 350 from one time period to another, quality and operation of devices produced from the processed semiconductor wafers 105 can significantly vary from one time period to another.

The present invention is directed to overcoming, or at least reducing the effects of, one or more of the problems set forth above.

SUMMARY OF THE INVENTION

In one embodiment of the present, a method is provided for performing periodic correction of metrology data. At least one semiconductor wafer is processed. Metrology data from the processed semiconductor wafer is acquired. At least one test wafer is processed. Test wafer metrology data from the processed test wafer is acquired. A test wafer metrology calibration process is performed upon the acquired metrology data using the acquired test wafer metrology data to produce a calibrated metrology data. At least one control input parameter adjustment is performed for subsequent manufacturing processes based upon the calibrated metrology data.

In another embodiment of the present invention, a system is provided for performing periodic correction of metrology data. The system of the present invention comprises: a metrology tool adapted to acquire metrology data from a processed semiconductor wafer; a metrology tool database electronically coupled to the metrology tool, the metrology tool database being adapted to store metrology data; a test wafer database electronically coupled to the metrology tool, the test wafer database being adapted to store test wafer metrology data; and a process control electronically coupled with the metrology tool database and the test wafer database, the process control being adapted to acquire data from the metrology tool database and the test wafer database to calibrate the metrology data and determine at least one control input parameter for processing a semiconductor wafer.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, by specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Errors that can occur during the processing of semiconductor wafers 105, such as forming transistor structures on a layer of the semiconductor wafers 105, can be measured and characterized. The measured and characterized errors can be then used to improve and correct certain processing steps that may result in processed semiconductor wafers 105 of higher quality and accuracy. However, errors in the measuring process itself can cause degradation of error data, which in turn can cause less accurate compensation for processing errors. Embodiments of the present invention provide for a periodic calibration of metrology data using test wafer data. Embodiments of the present invention also provide for calibrating metrology data acquisition tools by using metrology data from a test wafer with known metrology parameters. Embodiments of the present invention also provide for performing statistical process control (SPC) analysis and APC analysis based upon a test-wafer metrology calibration process.

Figure 2:
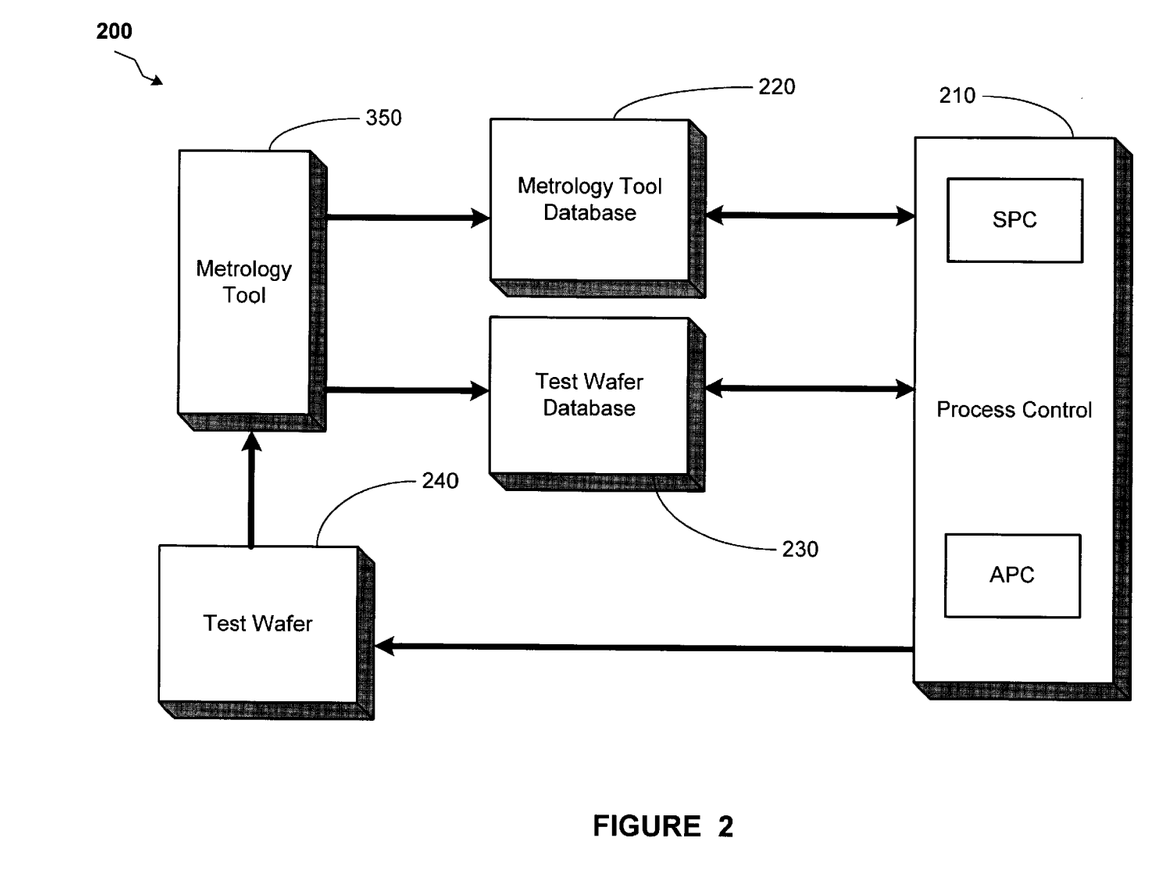
FIG. 2 illustrates a block diagram representation of one metrology data flow system, within a semiconductor-wafer manufacturing environment, in accordance with one embodiment of the present invention.

Turning now to FIG. 2, a metrology data flow system 200 in accordance with one embodiment of the present invention is illustrated. The system 200 comprises a process control 210, a metrology tool database 220, a test wafer database 230, and at least one metrology tool 350. The metrology tool database 220 receives metrology data acquired by a metrology tool 350. In one embodiment, a test wafer 240 is analyzed by one or more metrology tools 350. The metrology data relating to the test wafer 240 is then stored into the test wafer database 230. The process control 210 utilizes the data from the metrology tool database 220 and the test wafer database 230 to perform metrology data adjustments. That is, data stored in the metrology tool database 220 and the test wafer database 230 are used to calculate control parameter adjustments for subsequent processing steps performed on semiconductor wafers 105. The process control 210 performs adjustments and calibrations to the metrology data itself, before calculating adjustments to control input parameters of subsequent processes. The process control 210 utilizes the adjusted/calibrated metrology data to perform advanced process control (APC) adjustments and statistical process control (SPC) control and adjustments.

Generally, a metrology tool 350 behaves slightly differently from one time period to another, and/or from one process measurement to another. Many factors such as ambient temperature, manufacturing environment variations, random variation, can affect the results acquired from metrology tools 350 from one time period to another. The process control 210 utilizes current metrology data (i.e., metrology data acquired at real time) as well as previously acquired metrology data that is stored in the metrology tool database 220, and test wafer metrology data stored in the test wafer database 230, in order to perform calibration and other adjustments to a particular set of metrology data. In other words, previously acquired metrology data, real time metrology data, and test wafer metrology data are used to calculate an adjustment factor that is applied to a particular set of metrology data to increase the accuracy of the metrology data.

In one embodiment, the metrology tool database 220 may contain data relating to particular structures, such as line widths, critical dimensions of structures, such a gate of a transistor, and the like, of semiconductor wafer 105 being processed. The test wafer database 230 may contain measurements of known structures on the test wafer 240, such as line widths and critical dimension of various structures. The process control 210 can compare data in the metrology tool database 220 with corresponding data in the test wafer database and calculate a calibration factor for calibrating metrology tools 350.

Figure 3:
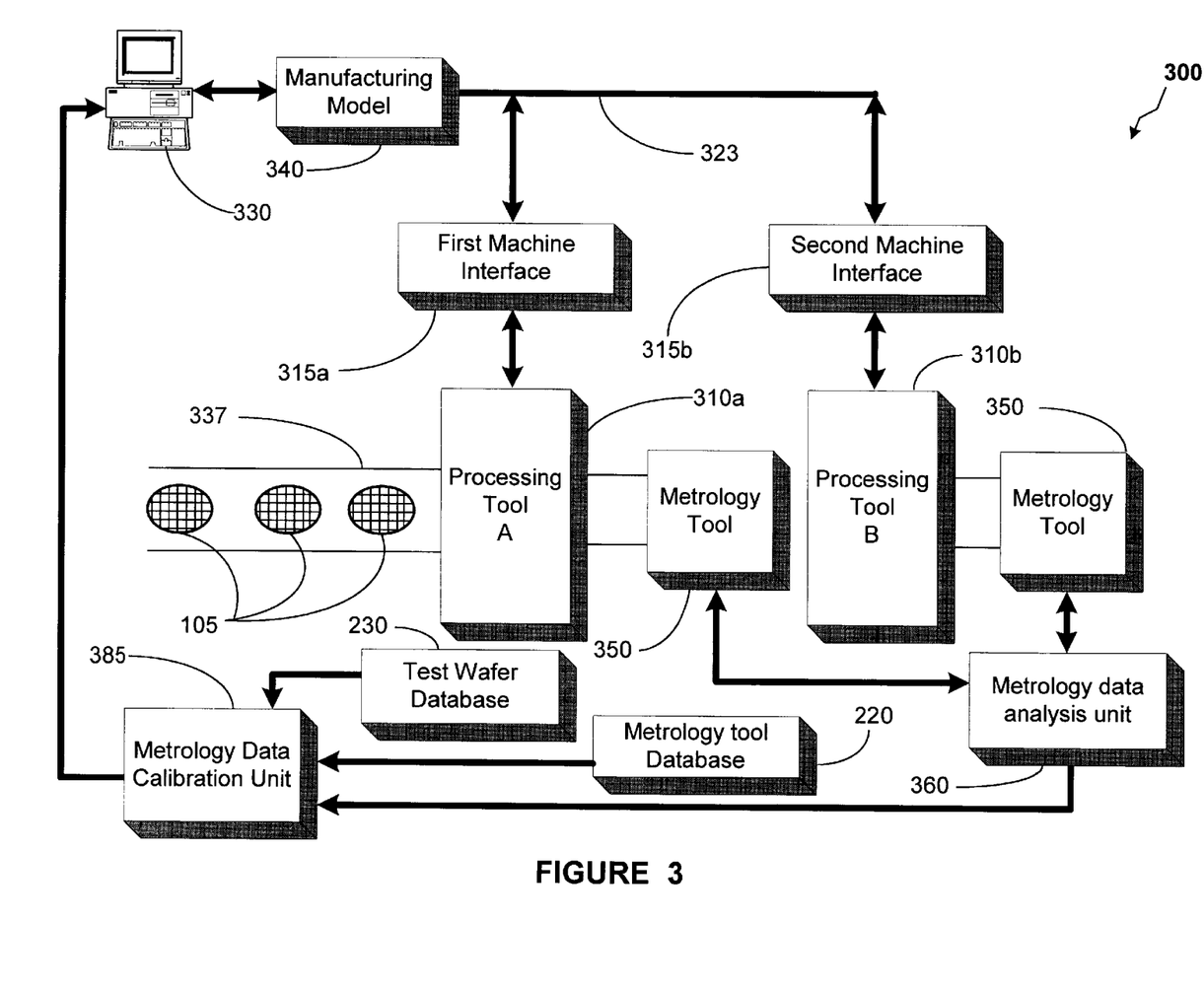
FIG. 3 illustrates a block diagram representation of a manufacturing system in accordance with one embodiment of the present invention.

Turning now to FIG. 3, a system 300 in accordance with one embodiment of the present invention is illustrated. In one embodiment; semiconductor wafers 105, are processed on processing tools 310a, 310b using a plurality of control input signals, or manufacturing parameters, on a line 323. In one embodiment, control input signals, or manufacturing parameters, on the line 323 are sent to the processing tools 310a, 310b from computer system 330 via machine interfaces 315a, 315b. In one embodiment, the first and second machine sinterfaces 315a, 315b are located outside the processing tools 310a, 310b. In an alternative embodiment, the first and second machine interfaces 315a, 315b are located within the processing tools 310a, 310b. A processing line 337 carries semiconductor wafers 105 to and from a plurality of processing tools 310. In one embodiment, semiconductor wafer 105 may be provided to a processing tool 310 manually. In an alternative embodiment, semiconductor wafer 105 may be provided to a processing tool 310 in an automatic fashion (e.g., robotic movement of semiconductor wafer 105). In one embodiment, a plurality of semiconductor wafers 105 are transported in bays (not shown) to processing tools 310.

In one embodiment, the computer system 330 sends control input signals, or manufacturing parameters, on the line 323 to the first and second machine interfaces 315a, 315b. The computer system 330 is capable of controlling processing operations. The computer system 330 employs a manufacturing model 340 to generate the control input signals on the line 323. In one embodiment, the manufacturing model 340 contains a manufacturing recipe that determines a plurality of control input parameters that are sent on the line 323.

In one embodiment, the manufacturing model 340 defines a process script and input control that implement a particular manufacturing process. The control input signals on the line 323 that are intended for processing tool A 310a are received and processed by the first machine interface 315a. The control input signals on the line 323 that are intended for processing tool B 310b are received and processed by the second machine interface 315b. Examples of the processing tools 310a, 310b used in semiconductor manufacturing processes are steppers, etch process tools, and the like.

One or more of the semiconductor wafers 105 that are processed by the processing tools 310a, 310b can also be sent to a metrology tool 350 for acquisition of metrology data. The metrology tool 350 can be a scatterometry data acquisition tool, an overlay-error measurement tool, a critical dimension measurement tool, and the like. In one embodiment, one or more processed semiconductor wafers 105 are examined by a metrology tool 350. Data from the metrology tool 350 is collected by a metrology data analyzer unit 360. The metrology data analyzer unit 360 organizes, analyses, and correlates metrology data acquired by the metrology tool 350 to particular semiconductor wafers 105 that were examined. The metrology data analyzer unit 360 can be a software unit, a hardware unit, or a firmware unit. In various embodiments, the metrology data analyzer unit 360 is integrated into the computer system 330 or may be integrated into the metrology tool 350.

The system 300 also comprises the metrology tool database 220, the test wafer database 230, and the metrology data calibration unit 385. As described above, metrology data acquired previously is stored in the metrology tool database 230. In one embodiment, each period of time that the metrology tools 350 are initially operated, the test wafer 240 is examined by the metrology tool 350. Data relating to previous and current measurements performed on the test wafer 240 is stored in the test wafer database 230, and is accessed by the metrology data analysis unit 360.

The metrology data calibration unit 385 receives real time or near real time metrology data from the metrology data analysis unit 360. The metrology data calibration unit 385 examines corresponding data stored in the metrology tool database 220 and the test wafer database 230 and compares them to the real time metrology data. For example, if the metrology data calibration unit 385 receives real time CD measurements of a transistor gate from the metrology data analysis unit 360, corresponding transistor gate CD measurement data from the metrology tool database 220 and the test wafer database 230 are examined and compared with the real time CD measurement data. Using calculation techniques known to those skilled in the art who have the benefit of the present disclosure, the metrology data calibration unit 385 calibrates the real time metrology data, which results in more accurate metrology data that has reduced amounts of random errors and errors due to changes in the manufacturing environment. Calibrating metrology data includes adjusting the measurement reading that represents metrology data by a calibration factor, which results in more accurate measurement data. The more accurate metrology data is then sent to the computer system 330 for feedback and/or feed-forward adjustments of manufacturing processes.

In one embodiment, the metrology data calibration unit 385 is a software entity that may reside within the computer system 330. In an alternative embodiment, the metrology data calibration unit 385 may be a hardware entity in the system 300. In yet another embodiment, the metrology data calibration unit 385 may be a firmware entity. In one embodiment, one or more of the metrology tool database 220, the test wafer database 230, and the metrology data calibration unit 385 are integrated within the computer system 330. In an alternative, metrology tool database 220, the test wafer database 230, and the metrology data calibration unit 385 are individual standalone components in the system 300.

Figure 4:
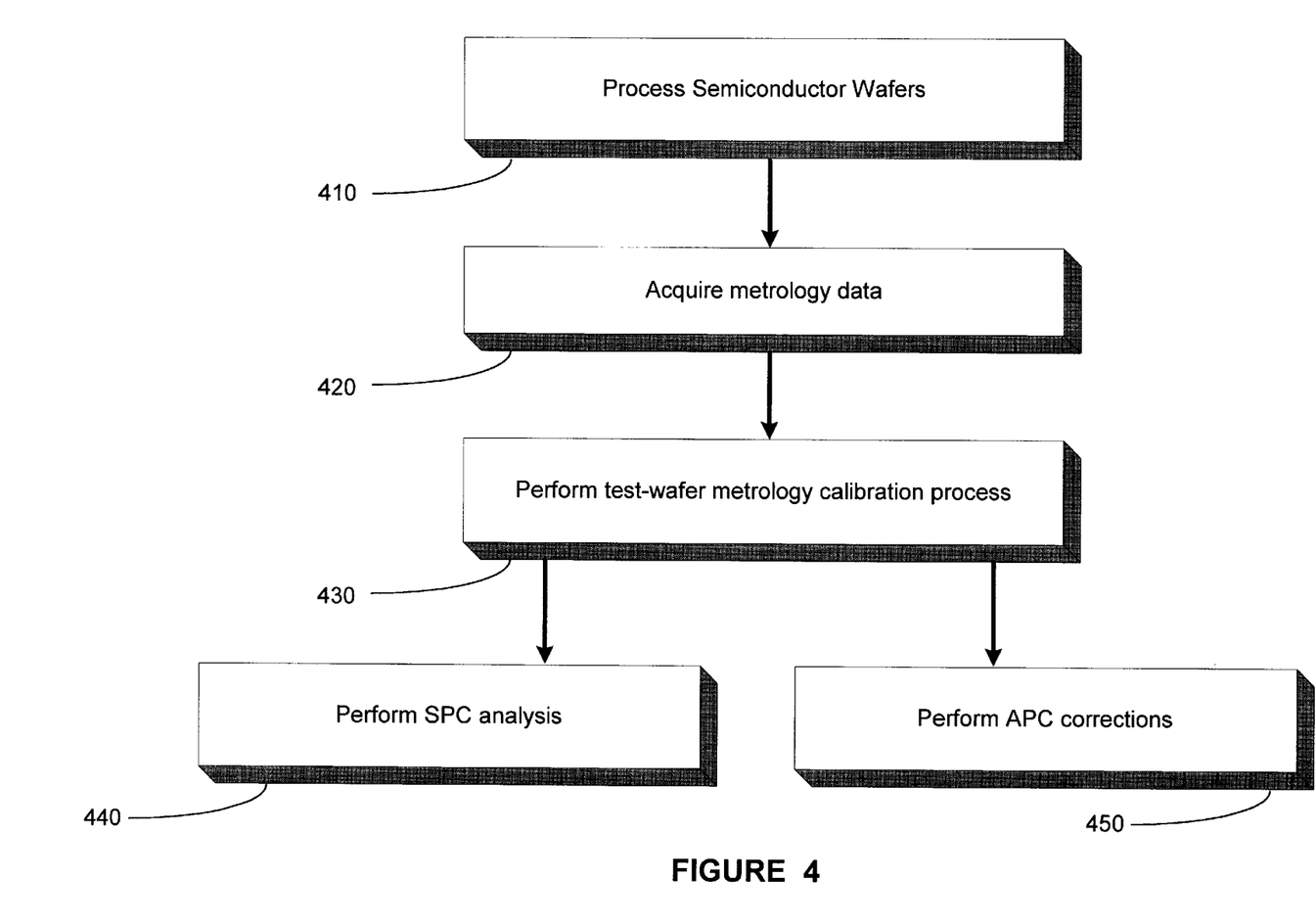
FIG. 4 illustrates a flowchart depiction of a method in accordance with one embodiment of the present invention.

Turning now to FIG. 4, a flowchart depiction of the method in accordance with one embodiment of the present invention is illustrated. In one embodiment, a manufacturing lot of semiconductor wafers 105 are processed (block 410). The processing of the semiconductor wafers 105 can comprise a photolithography process, an etch process, a chemical/mechanical planarization (CMP) process, and the like. The semiconductor wafers 105 are processed by the processing tools 310, which are controlled by the computer system 330 and the manufacturing model 340.

Once a particular process is performed on one or more semiconductor wafers 105, metrology data associated with the process is acquired from the semiconductor wafer 105 (block 420). Metrology data is acquired by examining the processed semiconductor wafers 105 using metrology tools 350. In one embodiment, the metrology tool 350 is a critical dimension (CD) measurement device. That is, the metrology tool 350 measures the critical dimensions of one or more structures (e.g., a gate for a transistor) formed on layers of a semiconductor wafer 105. In alternative embodiments, the metrology tool 350 can be an optical measurement tool, such as a scatterometry meter, or the like. Often, the performance of the metrology tool 350 can vary from one time period to another. Generally, there are slight drifts in the accuracy of the measurement data acquired by the metrology tools 350. In other words, the accuracy of the measurement data acquired by a particular metrology tool 350 may change from one time period to another.

In order to reduce the effects of the drifts in the measurements of metrology tools 350, the system 300 performs a test-wafer metrology calibration process, in accordance with one embodiment of the present invention (block 430). A more detailed description of the test-wafer metrology calibration process is provided below. Upon completion of the test wafer metrology calibration process, the system 300 is able to generate a more accurate metrology measurement. The metrology measurements are then used to perform a SPC (block 440) and an (APC) correction (block 450), in order to improve the accuracy of manufacturing processes performed on the semiconductor wafers 105. The SPC analysis and the APC correction performed on the semiconductor wafers 105 are described in more detail below.

Figure 5:
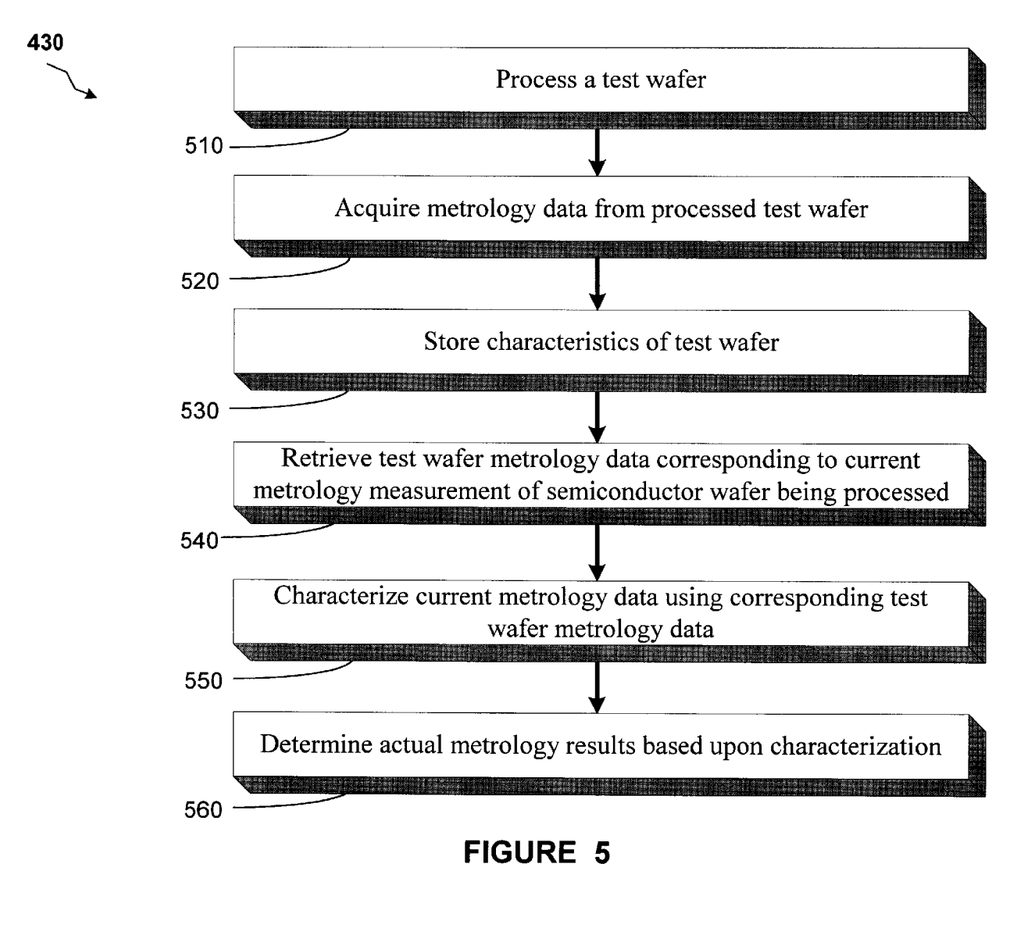
FIG. 5 illustrates a flowchart depiction of a method of performing a test-wafer metrology calibration process described in FIG. 4, in accordance with one embodiment of the present invention.

Turning now to FIG. 5, a more detailed flowchart depiction of one embodiment of performing the test-wafer metrology calibration process, described in block 430 of FIG. 4 is illustrated. In one embodiment, a test wafer 240 is processed by the system 300 (block 510). The processing of the test wafer 240 comprises placing the test wafer 240 in a manufacturing environment to perform at least one processing step and one metrology data acquisition step upon the test wafer 240. In one embodiment, the processing tools 310 are utilized to process the test wafers 240. The processing of the test wafer also includes forming structures on the test wafer that are representatives of features that are formed on actual production semiconductor wafers 105. For example, the test wafer 240 may contain shallow isolation trenches, such as trenches to form gates, collectors, and emitters, for the formation of a transistor. Generally, the same test wafer 240 is used to calibrate metrology tools 350 throughout a plurality of time periods. In an alternative embodiment, the test wafer 240 may contain known structures with known characteristics.

After at least one process is performed on the test wafer 240, the test wafer 240 is analyzed by the metrology tool 350 in order to acquire metrology data (test wafer metrology from the test wafer 240 (block 520). In an alternative embodiment, a test wafer 240 that contains known structures and characteristics (i.e., a test wafer 240 that was processed in advance) is analyzed by the metrology tool 350. The acquired metrology data relating to the test wafer 240 is stored by the system 300 (block 530). In one embodiment, metrology data relating to the test wafer 240 is stored into the test wafer database 230. Metrology data relating to the test wafer 240 includes critical dimension measurements, line width measurements, scatterometry measurements relating to a plurality of features on the test wafer 240, and the like.

During manufacturing of semiconductor wafers 105, after a metrology measurement is performed on a processed semiconductor wafer 105, the system 300 retrieves test-wafer metrology data corresponding to the current metrology measurement being analyzed (block 540). For example, if the system 300 performs a critical dimension measurement of a particular semiconductor wafer 105 being processed, the system 300 retrieves critical dimension metrology data relating to the test wafer 240 from the test wafer database 230. The system 300 correlates the actual metrology data relating to the critical dimensions on a semiconductor wafer 105 with the corresponding critical dimension metrology data from the test wafer 240, producing correlated metrology data. In other words, the system 300 analyses a particular critical dimension of a structure formed on the semiconductor wafer 105 and compares to measurement data relating to a similar structure on the test wafer 240. The system 300 then characterizes the current metrology data using the corresponding test wafer metrology data (block 550). A more detailed description of characterizing metrology data using test wafer metrology data is provided below. The system 300 then determines the actual metrology data results based upon the characterization of the current metrology data that is described in block 550 (block 560). Therefore, more accurate metrology data results are used to perform SPC and APC analyses and corrections.

Figure 6:
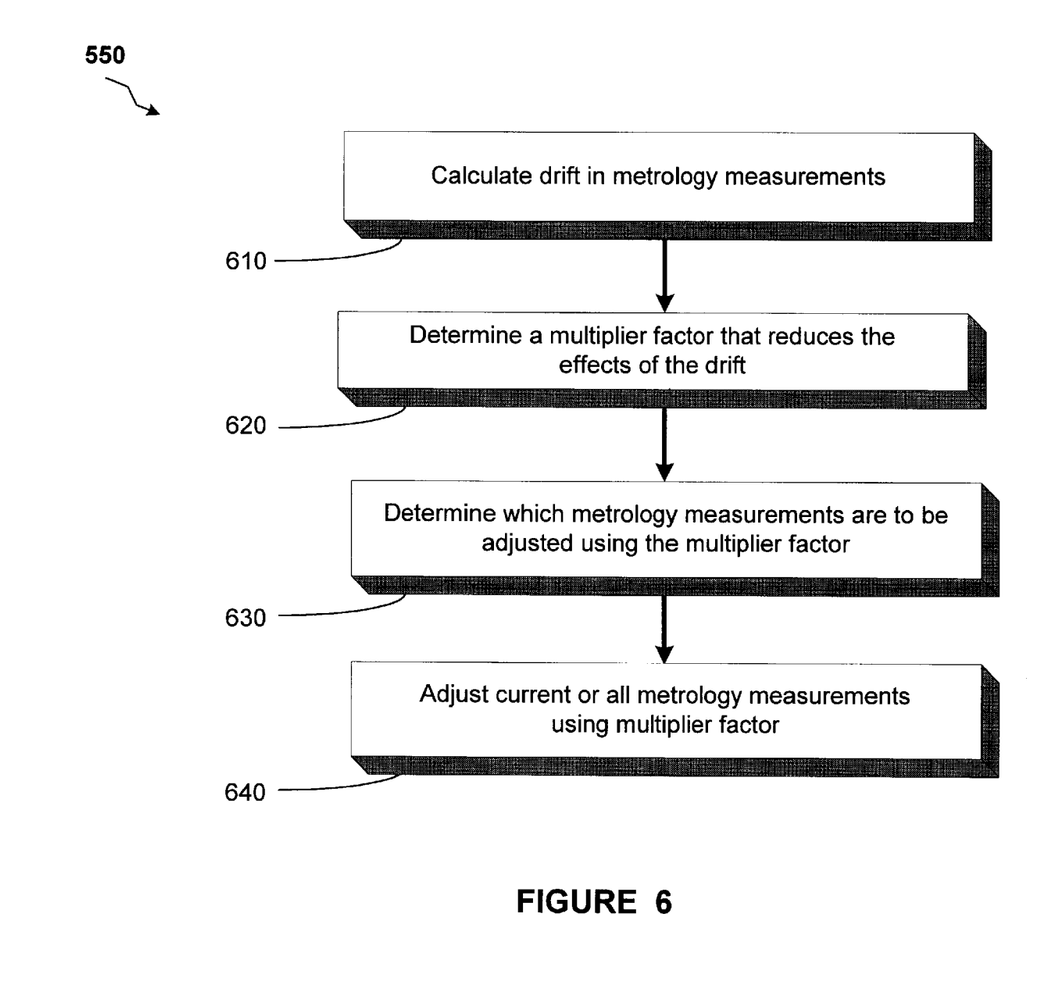
FIG. 6 illustrates a flowchart depiction of a method of characterizing metrology data using a test-wafer, as described in FIG. 5, in accordance with one embodiment of the present invention.

Turning now to FIG. 6, a more detailed flowchart depiction of the steps of performing the characterization of current metrology data based upon corresponding test-wafer metrology, indicated in block 550 of FIG. 5, is illustrated. The system 300 determines an amount drift in metrology measurements (block 610). The drift in the metrology measurements can be calculated using the test-wafer metrology data, previous metrology measurement data, the current metrology data, and their differences. The test-wafer metrology data is measured and recorded to serve as a metrology data reference point. Prior metrology data from previously processed semiconductor wafers 105 can also be used, in conjunction with test-wafer metrology data, as metrology data reference points. The system 300 retrieves test-wafer metrology data and metrology data relating to processed semiconductor wafers 105 from the test-wafer database 230 and the metrology data database, respectively.

The system 300 then utilizes the test-wafer metrology data and more recent metrology measurements in order to determine the amount of drift experienced by a particular metrology tool 350. In one embodiment, an algorithm defined by those skilled in the art who have the benefit of the present disclosure, can be used to calculate the drift in metrology measurements. Using information relating to the drift in metrology measurements, the system 300 determines a multiplier factor that can be used to reduce the effects of the drift in the current metrology measurements (block 620). In one embodiment, a ratio between the test wafer measurement values and the corresponding actual metrology measurement values can be used to calculate a multiplier factor.

The system 300 may determine that the drift experienced by a particular metrology tool 350 may affect only a certain type of metrology measurement. For example, a particular drift in the metrology tool 350 may affect measurements of critical dimension values, whereas measurements of polysilicon lines on the semiconductor wafer 105 may be measured accurately without an excessive amount of drift. Therefore, the system 300 determines which metrology measurements are to be adjusted using the multiplier factor (block 630). Once the system 300 determines which metrology measurements are to be adjusted, the system 300 adjusts the current (or real time) metrology measurements using the multiplier factor (block 640). In an alternative embodiment, the system 300 adjusts all metrology measurements using the multiplier factor for a particular time period. The adjusted metrology measurements can then be used by the system 300 to perform feedback or feed-forward corrections for subsequent processing of semiconductor wafers 105.

Figure 7:
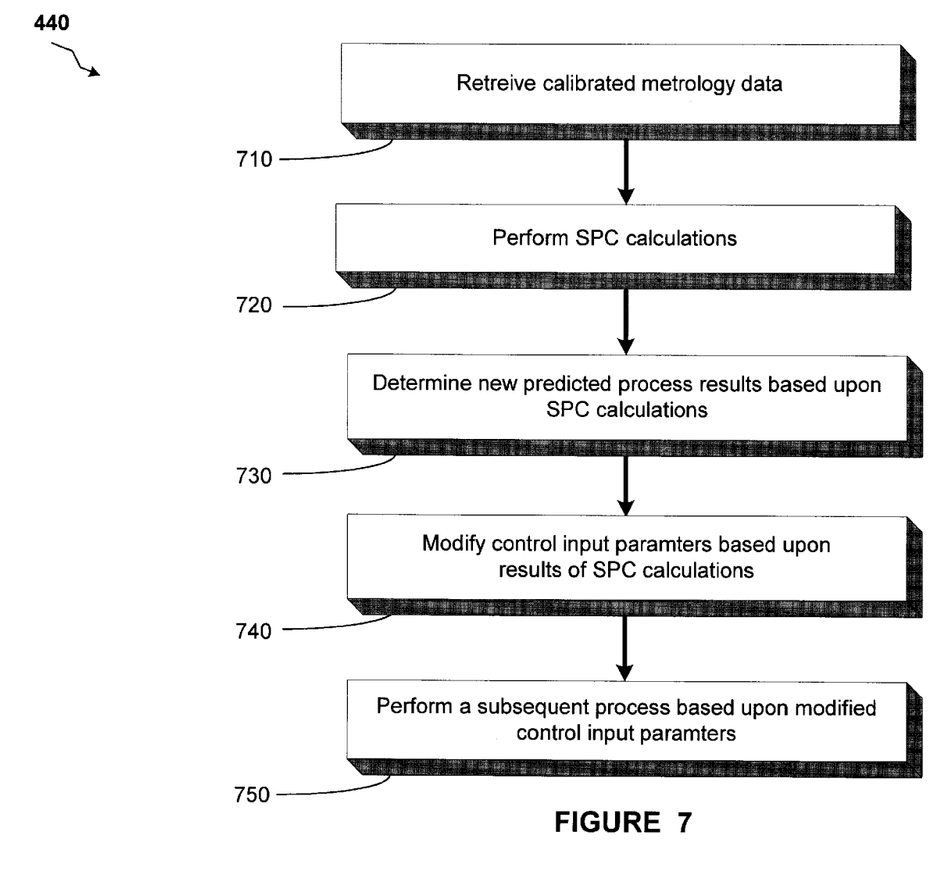
FIG. 7 illustrates a flowchart depiction of a method of performing a statistical processing control analysis described in FIG. 4, in accordance with one embodiment of the present invention.

The system 300 uses calibrated metrology data to perform SPC analysis and corrections to subsequent manufacturing processes. Turning back to FIG. 4, once the test-wafer metrology calibration process is substantially completed, the system 300 performs an SPC analysis using the newly adjusted metrology data, as described in block 440. Turning now to FIG. 7, a simplified flowchart diagram for performing SPC analysis in accordance with one embodiment of the present invention is illustrated.

In one embodiment, SPC is a method of monitoring, controlling, and, ideally, improving a process through statistical analysis. In one embodiment, SPC analysis is comprised of four main steps. The main steps of SPC analysis include measuring the process, reducing variances in the process to make the process more consistent, monitoring the process, and improving the process to produce its best value. In real-time SPC, which can be used for run-to-run control applications in one embodiment, data is collected from the most recently finished manufacturing run of semiconductor wafers before the next manufacturing run of semiconductor wafers is processed. Steps are taken to ensure that the quality of the processed semiconductor wafers is as consistent as possible from one manufacturing run to another. Generally, SPC analysis rules dictate that causes of errors discovered during one manufacturing run of semiconductor wafers must be corrected before the next manufacturing run of semiconductor wafers is performed. SPC is generally used for controlling the production line from a broad-control point of view. SPC generally monitors manufacturing parameters and activates alarms when the manufacturing parameters become out of control.

The system 300 acquires calibrated metrology data relating to one or more processes performed on semiconductor wafers 105 (block 710). In one embodiment, calibrated metrology data is stored in the metrology data database 220. The system 300 then performs SPC calculations using the acquired calibrated metrology data (block 720). In one embodiment, SPC software residing in the computer system 130 is used to perform SPC calculations. Standard SPC calculation methods that are known to those skilled in the art having benefit of the present disclosure, are employed for SPC analysis for the present invention. Performing SPC calculations includes comparing errors calculated from calibrated metrology data and examining how they differ statistically from predicted or target process results. Based upon this analysis, new predicted process results can be calculated for subsequent manufacturing processes (block 730).

The difference between the predicted process results and the actual process results is used to determine whether the manufacturing model 340 should be modified for the next manufacturing run of semiconductor wafers, thereby performing fault detection upon process control 210. Using results obtained by measuring manufacturing parameters and performing SPC analysis, the manufacturing model 140 can be modified to be used for subsequent manufacturing processes. Based upon new predicted process results, modifications to control input parameters, on the line 323, are calculated (block 740). Modification to control input parameters include modifying process recipes, adjusting exposure time periods for photolithography processes, modifying etch-time periods for etch processes, and the like. Based upon modified control input parameters, subsequent manufacturing processes are performed on semiconductor wafers 105 (block 750).

Figure 8:
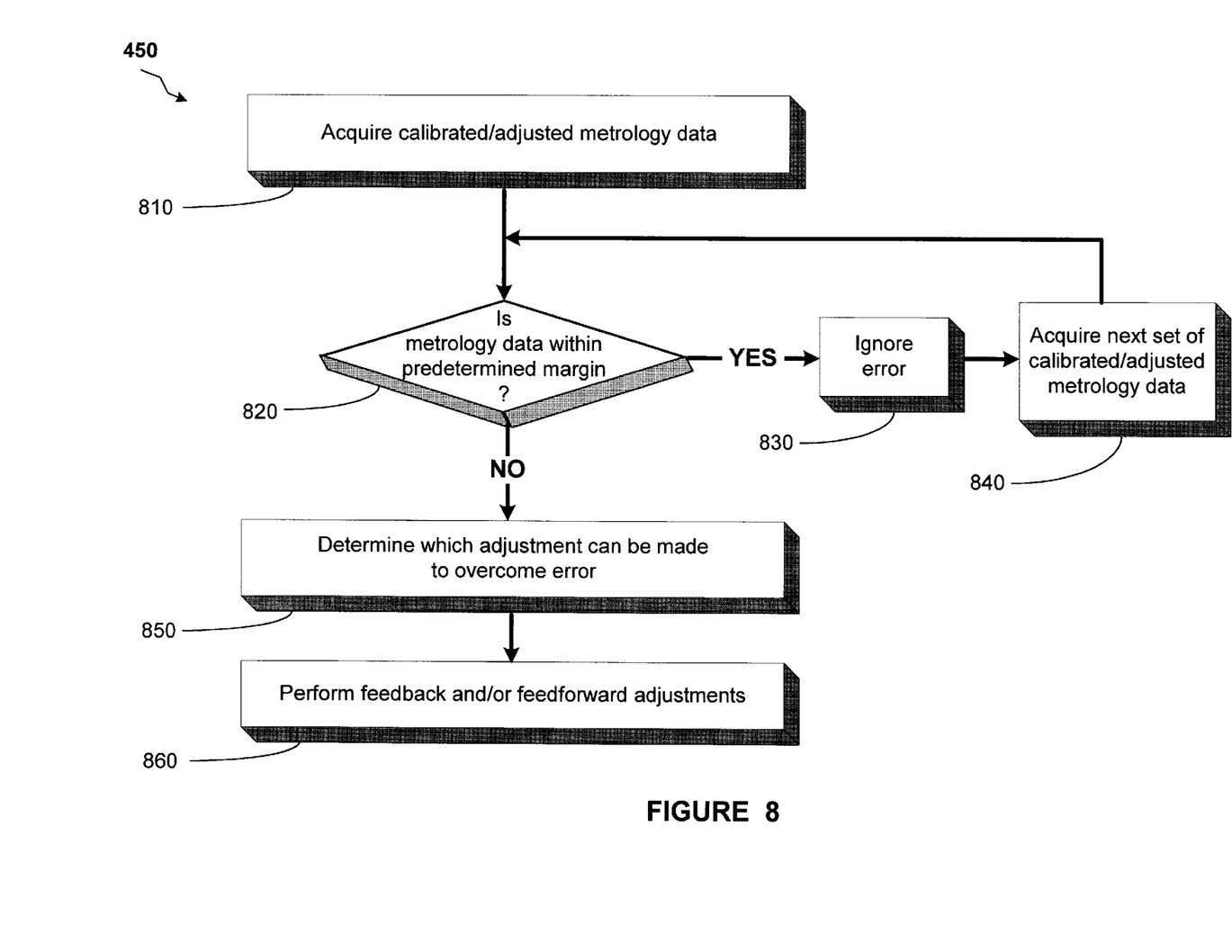
FIG. 8 illustrates a flowchart depiction of a method of performing an APC analysis described in FIG. 4, in accordance with one embodiment of the present invention.

The system 300 also uses calibrated metrology data to perform APC analysis and corrections to subsequent manufacturing processes. Turning back to FIG. 4, once the test-wafer metrology calibration process is substantially completed, the system 300 performs an APC analysis using the newly adjusted metrology data, as described in block 450. Turning now to FIG. 8, a simplified flowchart diagram for performing APC analysis in accordance with one embodiment of the present invention is illustrated.

After the system performs the test wafer metrology calibration process described in block 430 of FIG. 4, the system 300 acquires the calibrated/adjusted metrology data for a particular lot of semiconductor wafers 105 (block 810). The system 300 then analyzes the calibrated metrology data in order to determine if an error associated with the metrology data is within a predetermined acceptable margin of error (block 820). The error associated with metrology data is calculated by those skilled in the art who have the benefit of the present disclosure. When the system determines that the error associated with the metrology data is within a predetermined acceptable margin of error, the system 300 disregards the error (block 830) and acquires the next set of calibrated/adjusted metrology data for further analysis (block 840). When the system 300 determines that the error associated with the metrology data is outside a predetermined acceptable margin of error, the system 300 determines which control parameter adjustment can be made to reduce the effects of the error (block 850).

Once the system 300 determines which adjustment can be made to reduce the effects of the error, the system 300 performs a feedback and/or a feed-forward adjustment process to reduce the effects of the error (block 860). Feedback adjustments are generally made to reduce the amount of possible future error on similar subsequent processes. For example, the system 300 may provide a feedback adjustment to adjust the etch rate performed on subsequent lots of semiconductor wafer 105 in order to correct an error associated with over-etching of certain structures that are formed on layers of a semiconductor wafer 105.

Feed-forward adjustments are generally made to compensate for errors present on a semiconductor wafer 105, by modifying subsequent processes on that wafer. For example, in order to compensate for a line-width error, the system 300 may perform a feed-forward process that increases the amount of etching performed on a semiconductor wafer 105 to compensate for the line-width error. In either case, the calibrated/adjusted metrology data provides for a more accurate feed-forward or a feedback correction that can be performed on the semiconductor wafers 105 being processed. The calibration/adjustment of metrology data, and the calculation of drifts of metrology tools 350 can also be used to characterize the yields of a particular lot of semiconductor wafer 105. A more accurate assessment of the yield that results from processing of semiconductor wafers 105 can be made using the metrology adjustment processes called for by the present invention. The methods taught by the present invention may be utilized in other forms of manufacturing environments.

The principles taught by the present invention can be implemented in an Advanced Process Control (APC) Framework. The APC is a preferred platform from which to implement the control strategy taught by the present invention. In some embodiments, the APC an be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   processing at least one semiconductor wafer;
   acquiring metrology data from said processed semiconductor wafer;
   processing at least one test wafer;
   acquiring test wafer metrology data from said processed test wafer;
   performing a test wafer metrology calibration process upon said acquired metrology data using said acquired test wafer metrology data to produce a calibrated metrology data, wherein performing said test wafer metrology calibration process comprises calculating a drift relating to said metrology data; and
   performing at least one control input parameter adjustment for subsequent manufacturing processes based upon said calibrated metrology data.

2. The method described in claim 1, further comprising using one metrology tool to acquire said metrology data from said processed semiconductor wafer and said test wafer metrology data from said processed test wafer.

3. The method described in claim 2, wherein performing a test wafer metrology calibration process upon said acquired metrology data and said acquired test wafer metrology data further comprises:
   correlating metrology data related to said processing of semiconductor wafer to corresponding test wafer metrology data relating to said processing of test wafer;
   characterizing said metrology data using said correlated metrology data; and
   determining said calibrated metrology data based upon said characterizing of said metrology data.

4. The method described in claim 3, wherein characterizing said metrology data using said correlated metrology data further comprises:
   calculating a drift in said metrology data;
   determining a multiplier factor to reduce an effect of said drift;
   identifying a portion of said metrology data to be adjusted using said multiplier factor; and
   adjusting at least said portion of said metrology data using said multiplier factor.

5. The method described in claim 4, wherein determining a multiplier factor to reduce an effect of said drift further comprises:
   calculating a test measurement value using said test wafer metrology data;
   calculating an actual measurement value using said metrology data; and
   calculating a ratio of said test measurement value to said actual measurement value.

6. The method described in claim 1, wherein performing at least one control input parameter adjustment for subsequent manufacturing processes based upon said calibrated metrology data, further comprises performing a feedback adjustment for a subsequent process.

7. The method described in claim 1, wherein performing at least one control input parameter adjustment for subsequent manufacturing processes based upon said calibrated metrology data, further comprises performing a feedforward adjustment for a subsequent process.

8. The method described in claim 1, further comprising performing a statistical processing control (SPC) analysis based upon said test wafer metrology calibration process.

9. The method described in claim 8, wherein performing a statistical processing control analysis based upon said test wafer metrology calibration process further comprises:
   retrieving said calibrated metrology data;
   performing an SPC calculation using said calibrated metrology data;
   determining at least one predicted process result for a subsequent process based upon said SPC calculation; and
   modifying at least one control input parameter based upon said predicted process result and said SPC calculation.

10. A method, comprising:
    processing at least one semiconductor wafer;
    acquiring metrology data from said processed semiconductor wafer;
    processing at least one test wafer;
    acquiring test wafer metrology data from said processed test wafer;
    correlating metrology data related to said processing of semiconductor wafer to corresponding test wafer metrology data relating to said processing of test wafer;
    characterizing said metrology data using said correlated metrology data, wherein
    characterizing said metroloy data comprises calculating a drift relating to said metrology data;
    determining a calibrated metrology data based upon said characterizing of said metrology data; and
    performing at least one control input parameter adjustment for subsequent manufacturing processes based upon said calibrated metrology data.

11. The method described in claim 10, further comprising using one metrology tool to acquire said metrology data from said processed semiconductor wafer and said test wafer metrology data from said processed test wafer.

12. The method described in claim 11, wherein characterizing said metrology data using said correlated metrology data further comprises:

calculating a drift in said metrology data;

determining a multiplier factor to reduce an effect of said drift;

identifying a portion of said metrology data to be adjusted using said multiplier factor; and adjusting at least said portion of said metrology data using said multiplier factor.

13. The method described in claim 12, wherein determining a multiplier factor to reduce an effect of said drift further comprises:

calculating a test measurement value using said test wafer metrology data;

calculating an actual measurement value using said metrology data; and calculating a ratio of said test measurement value to said actual measurement value.

14. The method described in claim 10, wherein performing at least one control input parameter adjustment for subsequent manufacturing processes based upon said calibrated metrology data, further comprises performing a feedback adjustment for a subsequent process.

15. The method described in claim 10, wherein performing at least one control input parameter adjustment for subsequent manufacturing processes based upon said calibrated metrology data, further comprises performing a feed-forward adjustment for a subsequent process.

16. The method described in claim 10, further comprising performing a statistical processing control (SPC) analysis based upon said test wafer metrology calibration process.

17. The method described in claim 16, wherein performing a statistical processing control analysis based upon said test wafer metrology calibration process further comprises:

retrieving said calibrated metrology data;

performing an SPC calculation using said calibrated metrology data;

determining at least one predicted process result for a subsequent process based upon said SPC calculation; and modifying at least one control input parameter based upon said predicted process result and said SPC calculation.

18. A system, comprising:

a metrology tool adapted to acquire metrology data from a processed semiconductor wafer;

a metrology tool database electronically coupled to said metrology tool, said metrology tool database being adapted to store metrology data;

a test wafer database electronically coupled to said metrology tool, said test wafer database being adapted to store test wafer metrology data; and a process control electronically coupled with said metrology tool database and said test wafer database, the process control being adapted to acquire data from said metrology tool database and said test wafer database to correlate data from the metrology tool database and the test wafer database, and to calibrate said metrology data, wherein calibrating said metrology data comprises calculating a drift relating to said metrology data, and determine at least one control input parameter for processing a semiconductor wafer.

19. The system of claim 18, wherein said process control is capable of performing at least one of a statistical process control, a feedback control, and a feed-forward control of processing of a semiconductor wafer.

20. The system of claim 18, further comprising:

a computer system;

a manufacturing model coupled with said computer system, said manufacturing model being capable of generating and modifying at least one control input parameter signal;

a machine interface coupled with said manufacturing model, said machine interface being capable of receiving process recipes from said manufacturing model;

a processing tool capable of processing semiconductor wafers and coupled with said machine interface, said processing tool being capable of receiving at least one control input parameter signal from said machine interface;

a metrology data calibration unit coupled to said metrology tool database, to said computer system, and to said test wafer database, said metrology data calibration unit adapted to calibrate metrology data, wherein calibrating said metrology data comprises calculating a drift relating to said metrology data, using data from said metrology tool database and said test wafer database and to send said calibrated metrology data to said computer system.

21. The system of claim 20, wherein said computer system is capable of generating modification data for modifying at least one control input parameter in response to said calibrated metrology data.

22. The system of claim 21, wherein said manufacturing model is capable of modifying said control input parameter in response to said modification data.

23. An apparatus, comprising:

means for processing at least one semiconductor wafer;

means for acquiring metrology data from said processed semiconductor wafer;

means for processing at least one test wafer;

means for acquiring test wafer metrology data from said processed test wafer;

means for correlating metrology data related to said processing of semiconductor wafer to corresponding test wafer metro logy data relating to said processing of test wafer;

means for characterizing said metrology data using said correlated metrology data, wherein characterizing said metrology data comprises calculating a drift relating to said metrology data;

means for determining a calibrated metrology data based upon said characterizing of said metrology data; and means for performing at least one control input parameter adjustment for subsequent manufacturing processes based upon said calibrated metrology data.

24. A computer readable program storage device encoded with instructions that, when executed by a computer, performs a method, comprising:

processing at least one semiconductor wafer;

acquiring metrology data from said processed semiconductor wafer;

processing at least one test wafer;

acquiring test wafer metrology data from said processed test wafer;

correlating metrology data related to said processing of semiconductor wafer to corresponding test wafer metrology data relating to said processing of test wafer;

characterizing said metrology data using said correlated metrology data wherein characterizing said metrology data comprises calculating a drift relating to said metrology data;

determining a calibrated metrology data based upon said characterizing of said metrology data; and performing at least one control input parameter adjustment for subsequent manufacturing processes based upon said calibrated metrology data.

25. The computer readable program storage device encoded with instructions that, when executed by a computer, performs the method described in claim 24, the method further comprising using one metrology tool to acquire said metrology data from said processed semiconductor wafer and said test wafer metrology data from said processed test wafer.

26. The computer readable program storage device encoded with instructions that, when executed by a computer, performs the method described in claim 25, wherein characterizing said metrology data using said correlated metrology data further comprises:

calculating a drift in said metrology data;

determining a multiplier factor to reduce an effect of said drift;

identifying a portion of said metrology data to be adjusted using said multiplier factor; and adjusting at least said portion of said metrology data using said multiplier factor.

27. The computer readable program storage device encoded with instructions that, when executed by a computer, performs the method described in claim 26, wherein determining a multiplier factor to reduce an effect of said drift further comprises:

calculating a test measurement value using said test wafer metrology data;

calculating an actual measurement value using said metrology data; and calculating a ratio of said test measurement value to said actual measurement value.

28. The computer readable program storage device encoded with instructions that, when executed by a computer, performs the method described in claim 24, wherein performing at least one control input parameter adjustment for subsequent manufacturing processes based upon said calibrated metrology data, further comprises performing a feedback adjustment for a subsequent process.

29. The computer readable program storage device encoded with instructions that, when executed by a computer, performs the method described in claim 24, wherein performing at least one control input parameter adjustment for subsequent manufacturing processes based upon said calibrated metrology data, further comprises performing a feed-forward adjustment for a subsequent process.

30. The computer readable program storage device encoded with instructions that, when executed by a computer, performs the method described in claim 24, the method further comprising performing a statistical processing control (SPC) analysis based upon said test wafer metrology calibration process.

31. The computer readable program storage device encoded with instructions that, when executed by a computer, performs the method described in claim 30, wherein performing a statistical processing control analysis based upon said test wafer metrology calibration process further comprises:

retrieving said calibrated metrology data;

performing an SPC calculation using said calibrated metrology data;

determining at least one predicted process result for a subsequent process based upon said SPC calculation; and modifying at least one control input parameter based upon said predicted process result and said SPC calculation.

* * * * *

UNITED STATES PATENT AND TRADEMARK OFFICE
CERTIFICATE OF CORRECTION

PATENT NO.    : 6,597,447 B1
DATED         : July 22, 2003
INVENTOR(S)   : James B. Stirton and Kevin R. Lensing It is certified that error appears in the above-identified patent and that said Letters Patent is hereby corrected as shown below:

<u>Title page,</u>
Item [57], ABSTRACT,
Line 11, after "calibrated" add -- metrology data. --

<u>Column 1,</u>
Line 67, replace "linetype" with -- line-type --.

<u>Column 3,</u>
Line 53, after "forms," delete "by."

<u>Column 5,</u>
Line 17, replace "In one embodiment;" with -- In one embodiment, --.
Line 22, between "from computer" insert -- a --.
Line 24, replace "sinterfaces" with -- interfaces --.

<u>Column 7,</u>
Line 53, replace "(test wafer metrology" with -- (test wafer metrology data) --.

<u>Column 10,</u>
Line 67, replace "APC an" with -- APC can --.

<u>Column 12,</u>
Line 58, replace "metroloy" with -- metrology --.

<u>Column 14,</u>
Line 46, replace "metro logy" with -- metrology --.

Signed and Sealed this

Twenty-first Day of October, 2003

JAMES E. ROGAN
*Director of the United States Patent and Trademark Office*